United States Patent [19]
Fujioka et al.

[11] Patent Number: 4,985,753
[45] Date of Patent: Jan. 15, 1991

[54] SEMICONDUCTOR PACKAGE

[75] Inventors: Takashi Fujioka; Masahide Yamanouchi, both of Itami, Japan

[73] Assignee: Mitsubishi Denki Kabushiki Kaisha, Japan

[21] Appl. No.: 388,075

[22] Filed: Aug. 1, 1989

[30] Foreign Application Priority Data

Mar. 17, 1989 [JP] Japan .................................. 1-65663

[51] Int. Cl.$^5$ ...................... H01L 23/14; H01L 23/12
[52] U.S. Cl. ......................................... 357/80; 357/74
[58] Field of Search ...................... 357/74, 76, 81, 80; 333/246, 247

[56] References Cited

U.S. PATENT DOCUMENTS 3,936,864  2/1976  Benjamin ........................... 333/247
3,946,428  3/1976  Anazawo et al. ..................... 357/74
4,259,684  3/1981  Dean et al. ......................... 357/74

FOREIGN PATENT DOCUMENTS 63-164221  10/1988  Japan .

Primary Examiner—Rolf Hille
Assistant Examiner—S. V. Clark
Attorney, Agent, or Firm—Leydig, Voit & Mayer

[57] ABSTRACT

A semiconductor package comprises a package having a cavity for accommodating therein at least one semiconductor chip, at least one dielectric substrate with a peripheral circuit disposed thereon and one substrate cracking prevention plate, the cavity having therein a flat surface on which the semiconductor chip, the dielectric substrate and the substrate cracking prevention plate with a chip carrier can be mounted together.

22 Claims, 5 Drawing Sheets

SEMICONDUCTOR PACKAGE

BACKGROUND OF THE INVENTION

1. FIELD OF THE INVENTION

This invention relates to a semiconductor package, and in particular, to the structure of a package into which dielectric substrates with peripheral circuits formed by patterning are package together with semiconductor chips.

2. DESCRIPTION OF THE RELATED ART

FIGS. 5A and 5B show the structure of a conventional semiconductor device. It includes a package base 1 which is made of Cu and which has a rectangular protrusion 1a in its center. Formed on this protrusion 1a is a chip mounting section 1b in the form of a ridge extending along a line which is not always located on the central line of the package base 1. A semiconductor chip 8 is soldered to this chip mounting section 1b, and substrate cracking prevention plates 5 are soldered onto the upper surfaces of the protrusion 1a. A dielectric substrate 6 is soldered onto each of these substrate cracking prevention plates 5. The substrate cracking prevention plates 5 prevent any stress caused by the difference in the thermal expansion coefficients of the package base 1 and the dielectric substrates 6 from concentrating on the dielectric substrates 6. Accordingly, the plates 5 have a coefficient of thermal expansion lying between that of the package base 1 and that of the dielectric substrates 6. Peripheral circuits 6a such as matching circuits or bias circuits are formed by patterns of metal disposed on the dielectric substrates 6, the electrodes of the semiconductor chip 8 being connected to the respective peripheral circuits 6a through connecting wires 9 made of gold or the like. Further, the peripheral circuits 6a are connected to outwardly extending leads 7 through respective connecting wires 9.

An annular package frame 2 is brazed to the upper surface of the package base 1 so that it surrounds the protrusion 1a except for those sections where the external leads 7 are located. The leads 7 are mounted on ceramic bases 3 which are brazed onto the base 1. Brazed onto these ceramic bases 3 are ceramic tops 4, onto which the above-mentioned package frame 2 is brazed.

A cap 10 is soldered to the top section of the package frame 2. The cap 10, the package base 1, the package frame 2 and other elements define a cavity A for sealing the semiconductor chip 8, the dielectric substrates 6 and the substrate cracking prevention plates 5.

Thus, in the above-described semiconductor package, the chip mounting section 1b is formed on the package base 1, the semiconductor chip 8 being mounted on this chip mounting section 1b. Accordingly, the positions of the semiconductor chip 8 and of the dielectric substrates 6 are determined by the package base 1. That is, different package bases 1 may have to be used for different semiconductor chips 8 for different applications, resulting in poor utility.

In addition, the complicated configuration of the package base 1 requires close dimensional tolerances, resulting in a high production cost for manufacturing the semiconductor package.

SUMMARY OF THE INVENTION

This invention aims at eliminating the above-mentioned problems experienced in conventional semiconductor packages. It is accordingly an object of this invention to provide a semiconductor package which offers great utility and a substantial reduction in production costs.

In accordance with this invention, there is provided a semiconductor package comprising a package body having a cavity, a lower surface of said cavity being flat and having mounted thereon at least one semiconductor chip, at least one dielectric substrate and one substrate cracking prevention plate.

DESCRIPTION OF THE PREFERRED EMBODIMENTS

Embodiments of this invention will now be described with reference to the accompanying drawings.

Figure 1A:
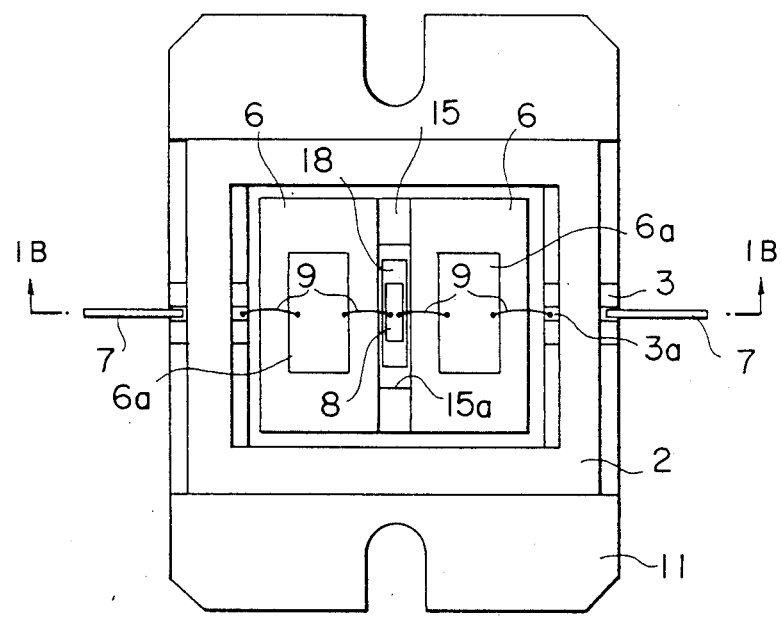
FIG. 1A is a plan view of a first embodiment of the semiconductor package according to the invention before a cap is attached thereto.
Figure 1B:
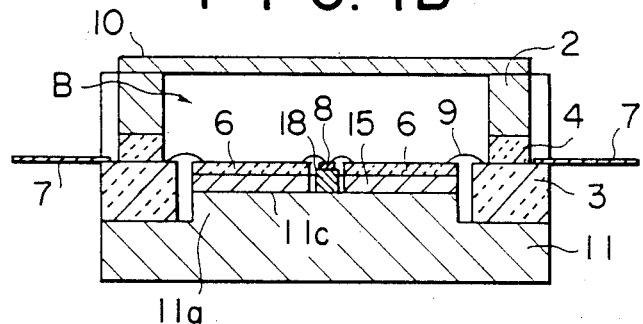
FIG. 1B is a sectional view of the embodiment of FIG. 1A, taken along the line I—I of FIG. 1A, with a cap attached thereto.

The embodiment shown in FIGS. 1A and 1B includes a package base 11 made of Cu. A rectangular protrusion 11a is formed in the central section of the upper surface of the package base 11. The protrusion 11a has a flat upper surface 11c for mounting a semiconductor chip 8, dielectric substrates 6, a substrate cracking prevention plate 15 and a chip carrier 18.

An annular package frame 2 is fixed to the package base 11 so that it surrounds the protrusion 11a. However, in those sections of the package base 11 where external leads 7 are located, cubic ceramic bases 3 are arranged. Formed on these ceramic bases 3 are conductive patterns 3a. One end of each lead 7 is fixed to each of these conductive patterns 3a. Provided on the ceramic bases 3 are ceramic tops 4, to which the above-mentioned package frame 2 is fixed. The package base 11, the package frame 2, the ceramic bases 3, the ceramic tops 4 and the leads 7 are fixed to each other by means of Ag-brazing, for example. A cap 10 is fixed to the top of the package frame 2 by means of soldering or welding. The cap 10, the package base 11, the package frame 2, the ceramic bases 3 and the ceramic tops 4 define an airtight cavity B.

Figure 1C:
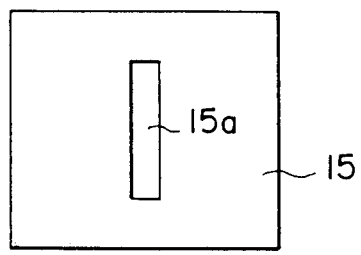
FIG. 1C is a plan view of the substrate cracking prevention plate used in the embodiment of FIG. 1A.

Soldered to the central section of the above-mentioned flat surface 11c situated within the cavity B is the substrate cracking prevention plate 15 which has a rectangular opening 15a, as shown in FIG. 1C. This substrate cracking prevention plate 15 is made of a material, such as kovar or molybdenum, the thermal expansion coefficient of which lies between that of Cu, the material for the package base 11, and that of the material for the dielectric substrates 6, which, for example, is alumina. The substrate cracking prevention plate 15 prevents stress from concentrating in the section between the package base 11 and the dielectric substrates 6 as a result of any temperature change which could cause cracking of the dielectric substrates 6. The dielectric substrates 6, which are two in this embodiment, are soldered to the substrate cracking prevention plate 15 on either side of the above-mentioned opening 15a. These dielectric substrates 6 are made of, for example, alumina. Peripheral circuits 6a such as matching circuits or bias circuits are formed by patterns of metal bases on the dielectric substrates 6. A chip carrier 18 made of Cu is fixed to that section of the flat surface 11c of the package base 11 which is within the above-mentioned opening 15a in the substrate cracking prevention plate 15 by means of soldering or an electrically conductive adhesive agent, a semiconductor chip 8 being soldered to the upper surface of this chip carrier 18.

Electrodes of the semiconductor chip 8 are connected to the respective peripheral circuits 6a formed on the dielectric substrates 6, through connecting wires 9 made of gold or the like. The peripheral circuits 6a are connected through connecting wires 9 to the conductive patterns 3a formed on the respective upper surfaces of the ceramic bases 3, thereby electrically connecting the peripheral circuits 6a to the leads 7 through the respective conductive patterns 3a.

The semiconductor device shown in FIGS. 1A and 1B is a transistor, the back-surface electrode of the semiconductor chip 8 being electrically connected to the package base 11 through the chip carrier 18.

This construction makes it possible to position of the semiconductor chip 8 on the flat surface 11c of the package base 11. That is, this provides a semiconductor package which can be applied to a variety of types of semiconductor chips 8 arbitrarily and consequently can be widely applied by changing the shape the substrate cracking prevention plate.

In addition, the above-described semiconductor package excels in heat radiation properties since the package base 11 and the chip carrier 18 are made of Cu, which has a high thermal conductivity. It goes without saying that the package base 11 and the chip carrier 18 can be made of some other material having a high thermal conductivity.

Furthermore, since that section of the package base 11 on which the semiconductor chip 8 is mounted has a simplified configuration, production conditions such as the dimensional tolerances for the package base 11 can be less strict, thereby facilitating the production of the semiconductor package and lowering the production cost thereof. In addition, since the substrate cracking prevention plate 15 consists of a single plate, the production process can also be simplified.

Figure 2A:
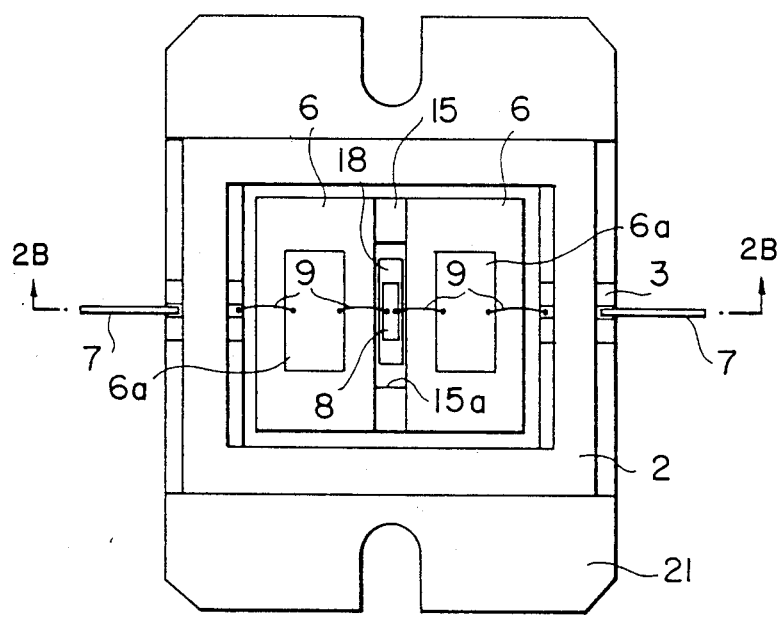
FIG. 2A is a plan view of a second embodiment of a semiconductor package according to the invention before a cap is attached thereto.
Figure 2B:
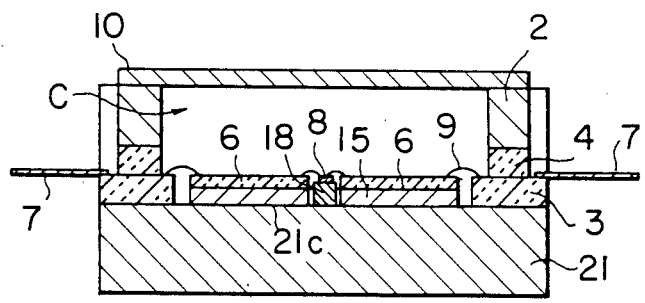
FIG. 2B is a sectional view of the embodiment of FIG. 2A, taken along line II—II of FIG. 2A, with a cap attached thereto.

FIGS. 2A and 2B show a second embodiment of this invention. In this embodiment, no central protrusion is provided on a package base 21 which has a flat surface 21c facing a cavity C. As in the first embodiment, a semiconductor chip 8 and dielectric substrates 6 are mounted through the intermediary of a chip carrier 18 and substrate cracking prevention plate 15, respectively. This arrangement further simplifies the configuration of the package base 21, so that the production of the package base is still further facilitated, and the production cost thereof lowered.

Figure 3A:
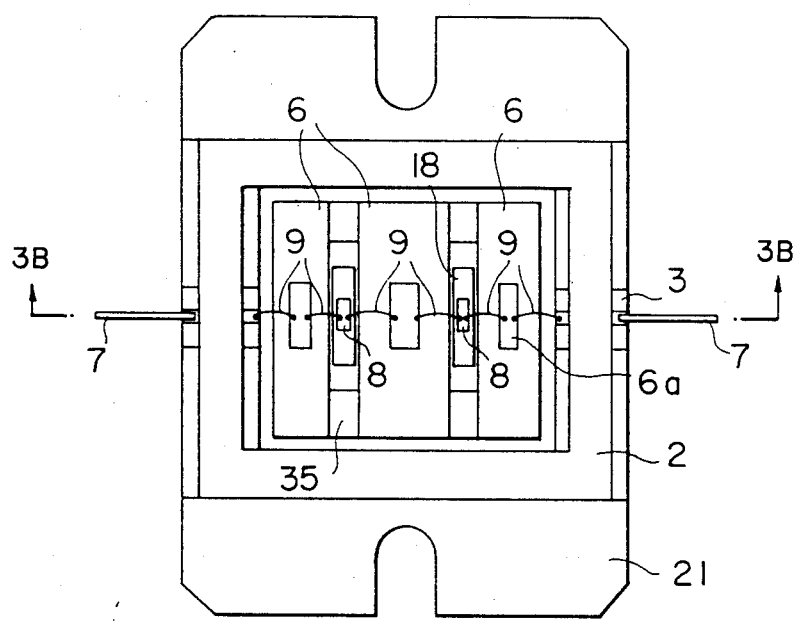
FIG. 3A is a plan view of a third embodiment of a semiconductor package according to the invention before a cap is attached thereto.
Figure 3B:
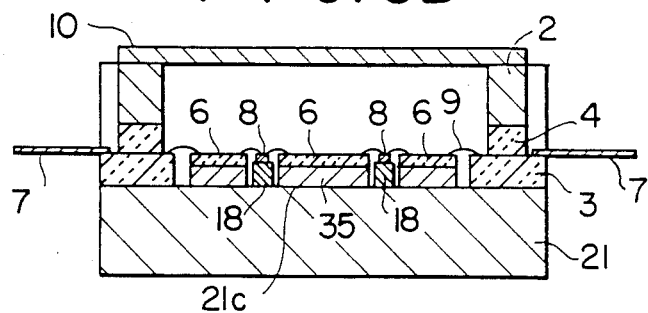
FIG. 3B is a sectional view of the embodiment of FIG. 3A, taken along the line III—III of FIG. 3A, with a cap attached thereto.
Figure 3C:
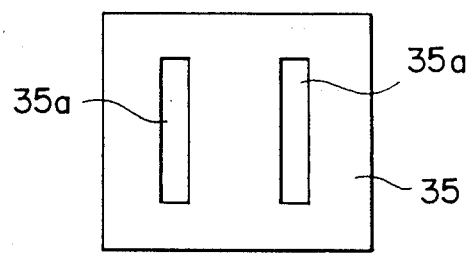
FIG. 3C is a plan view of the substrate cracking prevention plate used in the embodiment of FIG. 3A.

FIGS. 3A and 3B show a third embodiment of this invention, in which two semiconductor chips 8 are mounted on a package base 21. In this case, a substrate cracking prevention plate 35, equipped with two openings 35a as shown in FIG. 3C, is fixed onto the flat surface 21c of the package base 21, the semiconductor chips 8 and respective chip carriers 18 being disposed in the respective openings 35a. Three dielectric substrates 6 are provided on the substrate cracking prevention plate 35, with the openings 35a being positioned between them. The respective electrodes of the semiconductor chips 8 are electrically connected to the peripheral circuits 6a of the adjacent dielectric substrates 6.

Thus, a plurality of semiconductor chips 8 can be easily mounted solely by changing the shape of the substrate cracking prevention plate 35. Similarly, three or more semiconductor chips 8 can be mounted.

Figure 4A:
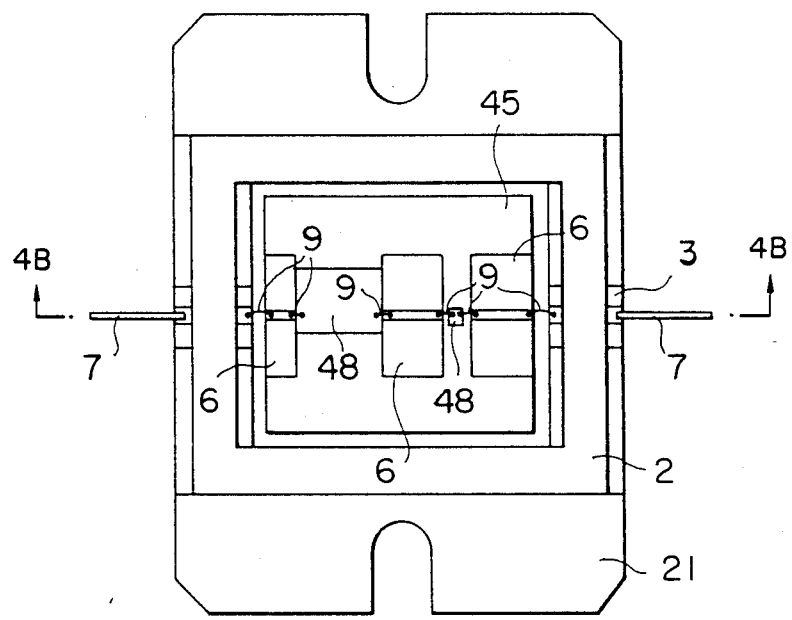
FIG. 4A is a plan view of a fourth embodiment of the semiconductor package according to the invention before a cap is attached thereto.
Figure 4B:
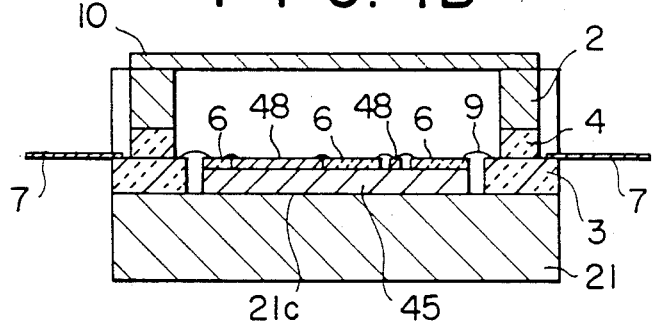
FIG. 4B is a sectional view of the embodiment of FIG. 4A, taken along the line IV—IV of FIG. 4A, with a cap attached thereto.
Figure 4C:
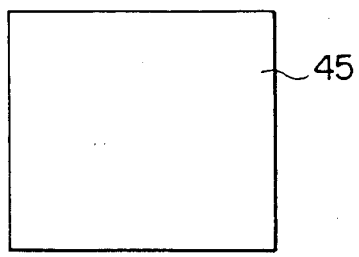
FIG. 4C is a plan view of the substrate cracking prevention plate used in the embodiment of FIG. 4A.
Figure 5A:
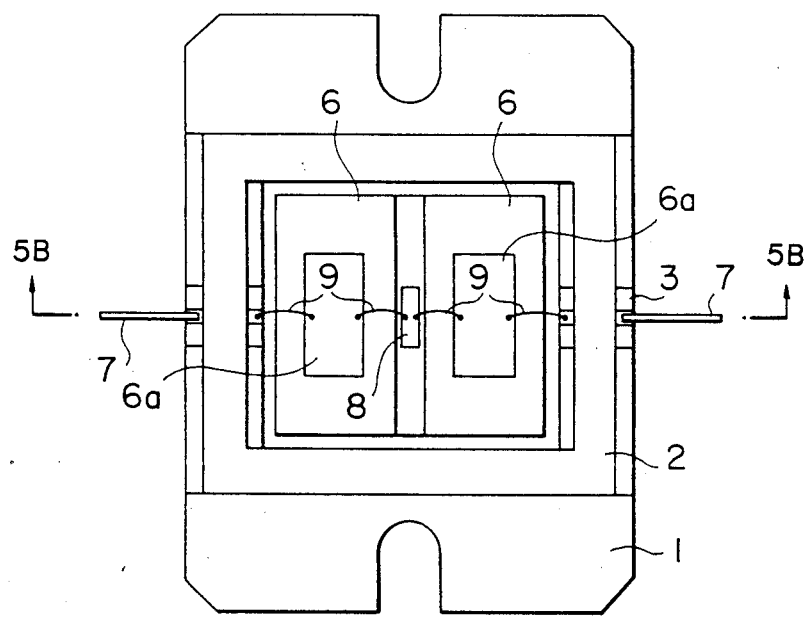
FIG. 5A is a plan view of a conventional semiconductor package before a cap is attached thereto.
Figure 5B:
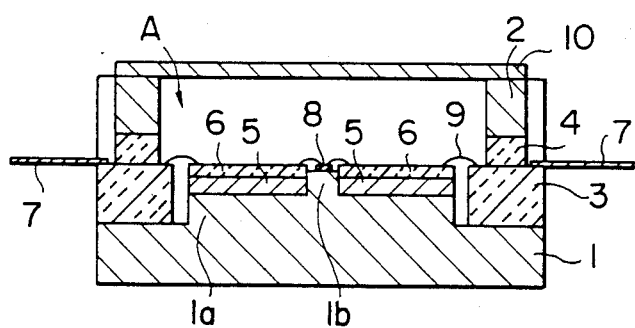
FIG. 5B is a sectional view of the conventional semiconductor package of FIG. 5A, taken along the line V—V of FIG. 5A, with a cap attached thereto.

FIGS. 4A and 4B show a fourth embodiment of this invention. In this embodiment, a panel-like substrate cracking prevention plate 45 with no opening, as shown in FIG. 4C, is fixed to the flat surface 21c of the package base 21. Two semiconductor chips 48 are arranged at appropriate positions on the substrate cracking prevention plate 45, three dielectric substrates 6 being arranged with the semiconductor chips 48 situated between them. The semiconductor chips 48 are small-signal semiconductor chips or power-saving semiconductor chips, so that they will not develop much heat when driven.

In the case of semiconductor chips 48 whose thermal resistance is not required to be low, as in this embodiment, the semiconductor chips 48 can be directly attached to the surface of the substrate cracking prevention plate 45, without using any chip carriers 18. As a result, more freedom is allowed in the arrangement of the semiconductor chips 48 and the dielectric substrates 6, which remarkably improves the utility of the semiconductor package. Furthermore, the simple construction of the package base 21 and the substrate cracking prevention plate 45 leads to a substantial reduction in production costs. In addition, since no chip carriers are required, the number of parts can be reduced. It is of course possible to mount three or more semiconductor chips 48 in cases where a substrate cracking prevention plate 45 with no openings is used, as in the fourth embodiment.

What is claimed is:

1. A semiconductor package comprising a package body including a cavity, a metal package base including a substantially planar surface disposed within the cavity, at least one semiconductor chip mounted on the surface, a substrate cracking prevention plate mounted on the surface within the cavity, and a dielectric substrate disposed on the substrate cracking prevention plate wherein the substrate cracking prevention plate has a coefficient of thermal expansion intermediate the coefficients of thermal expansion of the metal package base and the dielectric substrate and includes at least one central opening, the at least one semiconductor chip being disposed within the opening surrounded by the substrate cracking prevention plate.

2. A semiconductor package comprising:
a metal package base having a substantially planar surface on which at least one semiconductor chip and a substrate cracking prevention plate can be mounted;
a substrate cracking prevention plate mounted on the package base and including at least one central opening in which the at least one semiconductor chip can be disposed for mounting on the package base surrounded by the substrate cracking prevention plate;
at least one dielectric substrate mounted on the substrate cracking prevention plate;
an annular package frame attached to said package base surrounding an at least one semiconductor chip, the substrate cracking prevention plate mounted on the surface of said package base and the dielectric substrate, wherein the substrate cracking prevention plate has a coefficient of thermal expansion intermediate the coefficients of thermal expansion of the metal package base and the dielectric substrate; and
a cap for disposition on said package frame opposite said package base for enclosing a volume defined by the surface of said package base, said package frame, and said cap.

3. A semiconductor package as claimed in claim 2 wherein said package base includes a protrusion which protrudes into said volume, said surface being formed on said protrusion.

4. A semiconductor package as claimed in claim 2 wherein said package frame is attached to the surface of said package base.

5. A semiconductor package as claimed in claim 2 comprising a chip carrier disposed in said opening of said substrate cracking prevention plate, attached to the surface of said package base and on which said semiconductor chip is mounted.

6. A semiconductor package as claimed in claim 2 wherein said semiconductor chip is mounted on said substrate cracking prevention plate.

7. A semiconductor package as claimed in claim 2 comprising a plurality of leads extending out of said volume and a peripheral circuit disposed on said dielectric substrate, said leads being electrically connected to said semiconductor chip through the peripheral circuit.

8. A semiconductor package as claimed in claim 7 comprising lead supporting members made of an insulator through which said leads extend outwardly.

9. A semiconductor package as claimed in claim 2 wherein said metal package base is Cu.

10. A semiconductor package as claimed in claim 2 wherein said dielectric substrate is alumina.

11. A semiconductor package as claimed in claim 2 wherein said substrate cracking prevention plate is kovar.

12. A semiconductor package as claimed in claim 2 wherein said substrate cracking prevention plate is molybdenum.

13. A semiconductor package as claimed in claim 5 wherein said chip carrier is a metal.

14. A semiconductor package as claimed in claim 13 wherein said chip carrier is Cu.

15. A semiconductor package as claimed in claim 8 wherein said insulator is a ceramic.

16. A semiconductor package comprising:
a metal package base having a substantially planar surface;
a substantially planar substrate cracking prevention plate mounted on the surface and on which a semiconductor chip can be mounted;
at least two dielectric substrates mounted on the substrate cracking prevention plate proximate the semiconductor chip;
an annular package frame attached to said package base for surrounding a semiconductor chip mounted on the substrate cracking prevention plate, the substrate cracking prevention plate, and at least two dielectric substrates, wherein the substrate cracking prevention plate has a coefficient of thermal expansion intermediate the coefficients of thermal expansion of the metal package base and the dielectric substrates; and
a cap for disposition on said package frame opposite said package base for enclosing a volume defined by the surface of said package base, said package frame, and said cap.

17. A semiconductor package as claimed in claim 16 wherein said package frame is attached to the surface of said package base.

18. A semiconductor package as claimed in claim 16 wherein said substrate cracking prevention plate is attached to the surface of said package base within said volume and said dielectric substrates are mounted on said substrate cracking prevention plate on opposite sides of said semiconductor chip.

19. A semiconductor package as claimed in claim 16 wherein said package base is copper.

20. A semiconductor package as claimed in claim 16 wherein said dielectric substrates are alumina.

21. A semiconductor package as claimed in claim 16 wherein said substrate cracking prevention plates are one of kovar and molybdenum.

22. A semiconductor package comprising a package body including a cavity, a metal package base having a substantially planar surface disposed within the cavity, a substrate cracking prevention plate mounted on the surface within the cavity, at least one semiconductor chip mounted on the substrate cracking prevention plate, and at least two dielectric substrates disposed on the substrate cracking prevention plate on opposite sides of the semiconductor chip, wherein the substrate cracking prevention plate has a coefficient of thermal expansion intermediate the coefficients of thermal expansion of the metal package base and the dielectric substrates.

* * * * *